(12) United States Patent
Bertin et al.

(10) Patent No.: US 6,812,122 B2
(45) Date of Patent: Nov. 2, 2004

(54) METHOD FOR FORMING A VOLTAGE PROGRAMMING ELEMENT

(75) Inventors: Claude L. Bertin, South Burlington, VT (US); Erik L. Hedberg, Essex Junction, VT (US); Russell J. Houghton, Essex Junction, VT (US); Max G. Levy, Essex Junction, VT (US); Rick L. Mohler, Williston, VT (US); William R. Tonti, Essex Junction, VT (US); Wayne M. Trickle, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 10/095,889

(22) Filed: Mar. 12, 2002

(65) Prior Publication Data

US 2002/0093074 A1 Jul. 18, 2002

Related U.S. Application Data

(62) Division of application No. 09/466,495, filed on Dec. 17, 1999, now Pat. No. 6,388,305.

(51) Int. Cl.⁷ .............................................. H01L 21/44
(52) U.S. Cl. ........................ 438/600; 438/131; 438/467
(58) Field of Search ................................. 438/131, 417, 438/600, 957; 257/530

(56) References Cited

U.S. PATENT DOCUMENTS

| | | | |
|---|---|---|---|
| 4,507,756 A | | 3/1985 | McElroy |
| 4,543,594 A | | 9/1985 | Mohsen et al. |
| 4,673,962 A | * | 6/1987 | Chatterjee et al. ............ 257/68 |
| 4,698,589 A | | 10/1987 | Blankenship et al. |
| 4,767,722 A | * | 8/1988 | Blanchard .................... 437/41 |
| 4,855,628 A | * | 8/1989 | Jun ............................. 327/57 |
| 4,924,284 A | * | 5/1990 | Beyer et al. .................. 357/49 |
| 5,110,754 A | | 5/1992 | Lowrey et al. |
| 5,208,177 A | * | 5/1993 | Lee .............................. 257/530 |
| 5,242,851 A | | 9/1993 | Choi |
| 5,250,459 A | | 10/1993 | Lee |
| 5,258,643 A | * | 11/1993 | Cohen ......................... 257/530 |
| 5,282,158 A | * | 1/1994 | Lee ............................ 257/530 |
| 5,298,784 A | | 3/1994 | Gambino et al. |
| 5,331,196 A | | 7/1994 | Lowrey et al. |
| 5,444,650 A | | 8/1995 | Abe et al. |
| 5,568,350 A | | 10/1996 | Brown |

(List continued on next page.)

FOREIGN PATENT DOCUMENTS

| | | |
|---|---|---|
| JP | 02-030240 | 1/1990 |
| JP | 07-319776 | 12/1995 |
| JP | 07-336400 | 12/1995 |

OTHER PUBLICATIONS

D. Kenney et al, "A Buried Plate Trench Cell for a 64–Mb DRAM", Symp. VLSI Tech, Digest, pp. 14–15 (1992).
Chih–Ching Shih et al. "Characterization and Modeling of a Highly Reliable Metal–to–Metal Anitfuse for High–Performance and High–Density Plaid–Programmable Gate Arrays", IEEE, p. 25 (1997).
W. Tonti et al, "Impact of Shallow Trench Isolation on Reliability of Burted– and Surfaco–Channel sub μm PFBT", IEEE INternational Reliability Physic Proceedings, pp. 24–29 (1995).

Primary Examiner—Eddie Lee
Assistant Examiner—Douglas W Owens
(74) Attorney, Agent, or Firm—Robert A. Walsh

(57) ABSTRACT

Method for forming a first one time, voltage programmable logic element in a semiconductor substrate of first conductivity type, forming a first layer beneath a surface of the substrate, the first layer having a second conductivity type. A trench is formed through the surface and passing through the first layer. The trench comprises an interior surface, a dielectric material lining the interior surface and a conductive material filling the lined trench. The first logic element is configured so that a predetermined voltage or higher applied between the conductive material and the first layer causes a breakdown within a region of the trench.

7 Claims, 6 Drawing Sheets

U.S. PATENT DOCUMENTS

| | | | |
|---|---|---|---|
| 5,572,061 A | * 11/1996 | Chen et al. | 257/530 |
| 5,572,062 A | * 11/1996 | Iranmanesh | 257/530 |
| 5,602,053 A | 2/1997 | Zheng et al. | |
| 5,619,063 A | 4/1997 | Chen et al. | |
| 5,635,854 A | 6/1997 | Shimanek et al. | |
| 5,661,071 A | 8/1997 | Chor | |
| 5,668,751 A | 9/1997 | Sher et al. | |
| 5,672,905 A | 9/1997 | Lee et al. | |
| 5,726,484 A | 3/1998 | Hart et al. | |
| 5,759,907 A | 6/1998 | Assaderaghi et al. | |
| 5,786,240 A | 7/1998 | Look et al. | |
| 5,787,044 A | 7/1998 | Duesman | |
| 5,811,315 A | 9/1998 | Yindeepol et al. | |
| 5,831,301 A | 11/1998 | Horak et al. | |
| 5,854,114 A | * 12/1998 | Li et al. | 438/296 |
| 5,989,978 A | * 11/1999 | Peidous | 438/436 |
| 6,002,160 A | * 12/1999 | He et al. | 257/513 |
| 6,088,273 A | * 7/2000 | Lin et al. | 365/194 |
| 6,097,072 A | * 8/2000 | Omid-Zohoor | 257/397 |
| 6,130,469 A | * 10/2000 | Bracchitta et al. | 257/530 |
| 6,194,772 B1 | * 2/2001 | Tung | 257/501 |
| 6,218,722 B1 | * 4/2001 | Cervin-Lawry et al. | 257/530 |

* cited by examiner

METHOD FOR FORMING A VOLTAGE PROGRAMMING ELEMENT

This application is a division of application Ser. No. 09/466,495, filed Dec. 17, 1999, which is now patent No. 6,388,305 B1, issued on May 14, 2002.

FIELD OF THE INVENTION

The present invention relates to semiconductor integrated circuits, and more specifically to semiconductor antifuses and methods for forming the same.

CROSS-REFERENCE TO RELATED APPLICATIONS

The present application is related to commonly assigned U.S. patent application Ser. No. 09/466,479, filed on oven date herewith which is hereby incorporated by reference herein in its entirety.

BACKGROUND OF THE INVENTION

To increase device yield, semiconductor integrated circuits such as DRAM and SRAM memories employ redundant circuitry that allows the integrated circuits to function despite the presence of one or more manufacturing or other defects (e.g., by employing the redundant circuitry rather than the original, defective circuitry). For example, conventional DRAM and SRAM memories often use laser fuse blow techniques as part of their redundancy scheme wherein redundant circuitry may be employed in place of defective circuitry by blowing one or more fuses with a laser beam.

While laser fuse blow techniques improve device yield, several problems remain. Laser fuse blow techniques must be performed at the wafer level and thus are time consuming and costly. For example, a wafer typically must leave a test station for fuses to be blown, and then returned to the test station for verification. For DRAM memories, post burn-in module yield loss can reach 80% due to single cell bit fails. However, while single cell fails are recoverable with redundancy, laser fuse blow techniques cannot be applied to modules. Device yield therefore remains low despite the use of laser fuse blow techniques. Accordingly, a need exists for improved techniques for implementing redundancy within semiconductor integrated circuits.

SUMMARY OF THE INVENTION

To address the needs of the prior art, novel electronically programmable elements or "antifuses" are provided which have relatively high resistances (e.g., a few Mohms or more) when unblown and relatively low resistances (e.g., a few kohms or less) when blown. Specifically, in a first aspect of the invention, a first one time, voltage programmable logic element is provided in a semiconductor substrate of first conductivity type (e.g., p-type) that comprises a first layer beneath a surface of the substrate, the first layer having a second conductivity type (e.g., n-type); and a trench formed through the surface and passing through the first layer. The trench comprises an interior surface, a dielectric material lining the interior surface of the trench and a conductive material filling the lined trench. The first logic element is configured (e.g., through selection of the doping level of the first layer, the type and thickness of the dielectric material, the type of conductive material (typically n+ doped polysilicon having a doping level of about $1 \times 10^{19}$ cm$^{-3}$ or greater), etc.) so that a predetermined voltage or higher applied between the conductive material and the first layer causes a breakdown within a region of the trench. Prior to breakdown, the first logic element has a high resistance (e.g., a few Mohms or more), and after breakdown, the first logic element has a low resistance (e.g., a few kohms or less).

In a second aspect of the invention, a second one time, voltage programmable logic element is provided in a semiconductor substrate of first conductivity type that comprises a first layer formed in a surface of the substrate, the first layer having a second conductivity type; and a trench formed through the surface of the substrate and passing through the first layer. The trench comprises an interior surface, a first dielectric material lining the interior surface of the trench and a second dielectric material filling the lined trench. The second logic element further comprises a dielectric layer formed over a portion of the first layer and contacting the first dielectric material lining the trench at a merge location; and an electrode extending over a portion of both the dielectric layer and the filled trench. The second logic element is configured (e.g., through selection of the doping level of the first layer, the type and thickness of the first dielectric material, the type of second dielectric material, the type of electrode, the type and thickness of the dielectric layer (typically an oxide, a nitrided oxide or an oxide-nitride-oxide stack having a thickness less than about 100 angstroms), etc., so that a predetermined voltage or higher applied between the electrode and the first layer causes a breakdown near the merge location. Prior to breakdown, the second logic element has a high resistance (e.g., a few Mohms or more), and after breakdown, the second logic element has a low resistance (e.g., a few kohms or less). Methods for forming the first and the second logic elements also are provided.

Because the first and the second logic elements are electronically programmable, the logic elements are well suited for use in redundant circuitry schemes. For example, the logic elements can be blown at the module level of a circuit design while a wafer remains at a test station. Both device yield and test throughput thereby are significantly increased.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
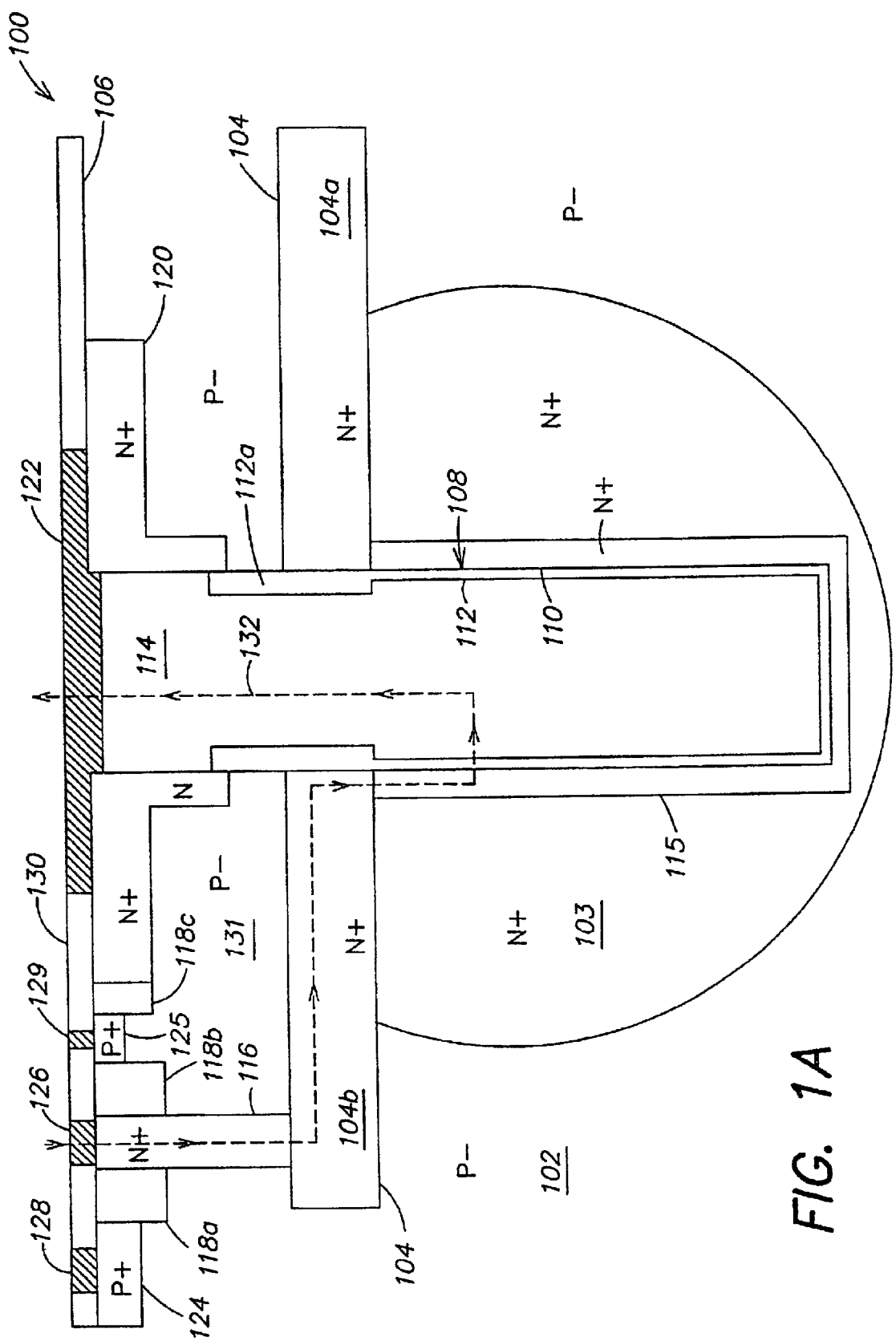
FIG. 1A is a cross-sectional diagram of a first antifuse element configured in accordance with a first aspect of the invention.

FIG. 1A is a cross-sectional diagram of a first logic element (first antifuse element 100) configured in accordance with a first aspect of the invention. The first antifuse 100 comprises a p− substrate 102 (e.g., a p− silicon substrate) having an n+ diffusion region 103 and an n+ buried layer 104 formed below a surface 106 of the p− substrate 102 (e.g., via a diffusion process and ion implantation, respectively, as are known in the art). The preferred doping levels for the p− substrate 102, for the n+ diffusion region 103 and for the n+ buried layer 104 are about $1 \times 10^{15}$–$1 \times 10^{16}$ cm$^{-3}$, greater than about $1 \times 10^{18}$ cm$^{-3}$ and about $1 \times 10^{18}$–$2 \times 10^{19}$ cm$^{-3}$, respectively. A trench 108 comprising an interior surface 110 is formed through the surface 106 and the n+ buried layer 104 (e.g., via a dry-etching process such as reactive ion etching (RIE)), so as to form a first and a second buried layer region 104a, 104b. Preferably the first and second buried layer regions 104a, 104b remain electrically connected. As described below, the n+ diffusion region 103 typically is formed after the trench 108 is formed.

The interior surface 110 of the trench 108 is lined with a dielectric material 112. For example, the dielectric material 112 may comprise silicon dioxide, silicon nitride, a nitride-oxide (NO) stack, an oxide-nitride-oxide (ONO) stack or the like deposited by plasma enhanced chemical vapor deposition. Preferably the dielectric material 112 comprises an NO stack having an overall thickness of about 30–80 angstroms. As shown in FIG. 1A, the thickness of the dielectric material 112 is increased in the vicinity of the n+ buried layer 104 (forming a dielectric collar 112a) so as to avoid breakdown of the dielectric material 112 in this region (described further below). The preferred thickness for the dielectric collar 112a is about 250 angstroms.

Following formation of the dielectric material 112 on the interior surface 110, the lined trench 108 is filled with a conductive material 114, and the resulting structure is planarized (e.g., via chemical mechanical polishing) so that the conductive material 114 resides only within the lined trench 108. Preferably, the conductive material 114 comprises N-type polysilicon deposited as in-situ doped and having a doping level of about $1 \times 10^{19}$ cm$^{-3}$ or greater. However, other conductive materials such as tungsten may be similarly employed. An n+ region 115 is formed in the p− substrate 102 (e.g., via ion implantation) that surrounds the trench 108 and connects to both the first and second buried layer regions 104a, 104b as shown.

To allow electrical connection to the n+ buried layer 104, an n+ connection 116 is provided that extends from the surface 106 to the n+ buried layer 104. The n+ connection 116 may be formed by ion implantation, and preferably has a doping level of about $1 \times 10^{18}$ cm$^{-3}$. The n+ connection 116 is isolated via a first and a second shallow trench isolation region (STI) 118a, 118b. Similarly, to allow electrical connection to the conductive material 114, a surface contact structure (e.g., a surface contact ring 120) is provided within the p− substrate 102. The surface contact ring 120 extends below the surface 106 so as to contact both the dielectric material 112 and the conductive material 114 as shown and preferably has a doping level of about $5 \times 10^{19}$ cm$^{-3}$. Preferably a metal contact 122 also is provided that directly contacts the conductive material 114 so as to reduce the contact resistance to the conductive material 114. The metal contact 122 may comprise any metal such as copper, aluminum, tungsten or a silicide formed by physical vapor deposition or by any other known metal deposition technique. Note that if the metal contact 122 is aligned so as to contact only the conductive material 114 (e.g., so as not to short to the p− substrate 102) the surface contact ring 120 may be eliminated.

To allow electrical connection to the p− substrate 102, a substrate contact (p+ region 124) also is provided. The p+ region 124 may be part of a guard ring structure or may be shared with another structure distal from the first antifuse 100 (if desired), and preferably has a doping level of about $5 \times 10^{19}$ cm$^{-3}$. An inner p+ region 125 (isolated from the surface contact ring 120 by an STI region 118c) provides contact (via a metal contact 129) to the p− region 131 defined by the n+ buried layer 104, the n+ connection 116 and the surface contact ring 120. The inner p+ region 125 preferably has a doping level of about $5 \times 10^{19}$ cm$^{-3}$. Metal contacts 126 and 128 (e.g., copper, aluminum, etc.) connect the n+ connection 116 and the p+ region 124, respectively, to the outside world, and the metal contact 122, the metal contact 126 and the metal contact 128 are electrically isolated from one another via a silicon dioxide layer 130.

The processing steps required for the formation of the first antifuse 100 may be performed in any order. For example, a suitable process sequence for the first antifuse 100 is as follows:

1. etch the trench 108;
2. deposit arsenic doped glass (ASG) so as to conformally coat the trench 108 (e.g., with about 80 nanometers of ASG);
3. fill the trench 108 with photoresist;
4. remove about 1.5 microns of photoresist within the trench 108 to form a recess therein (e.g., to a depth just below the n+ buried layer 104), and remove photoresist from the top surface of the substrate 102;
5. etch the exposed ASG within the trench 108 (e.g., to prevent doping of the device region above and including the n+ buried layer 104) and from the top surface of the substrate 102 (e.g., employing a wet etch in buffered hydrofluoric acid diluted 40:1);
6. remove photoresist from the trench 108;
7. deposit an oxide (e.g., via a TEOS process as is known in the art) that fills the trench 108 and coats the top surface of the substrate 102 so as to prevent autodoping during drive-in of the ASG;
8. perform ASG drive-in (e.g., at a temperature of about 950° C. for 10 minutes, 1050° C. for about 30 minutes and 950° C. for about 10 minutes) so as to form the n+ diffusion region 103;
9. remove deposited oxide and etch the ASG from the trench 108 (e.g., employing a wet etch in buffered hydrofluoric acid diluted 40:1);
10. line the trench 108 with the dielectric material 112 (e.g., deposit silicon nitride and re-oxidize the deposited silicon nitride via steam oxidation at a temperature of between about 800–900° C. for approximately 10 minutes so as to form an NO stack having a thickness of about 30–80 angstroms);

11. partially fill the trench 108 with the conductive material 114 to about the level of the n+ buried layer 104;

12. form a thicker dielectric material layer on the side walls of the unfilled portion of the trench 108 and etch the dielectric material layer to form the dielectric collar 112a in the vicinity of the n+ buried layer 104 (e.g., about 1 micron below the surface 106 of the p− substrate 102);

13. complete filling of the trench 108 with the conductive material 114 and planarize the p− substrate 102;

14. form the STI regions 118a, 118b;

15. perform the p and n implants with appropriate masking to generate the n+ buried layer 104, the n+ region 115, the n+ connection 116, the surface contact ring 120 and the p+ region 124;

16. deposit and pattern the silicon dioxide layer 130; and 17. form the metal contact 122, the metal contact 126 and the metal contact 128.

Following fabrication, the first antifuse 100 is in an "unblown" or "unprogrammed" state. Specifically, the electrical resistance of the path from the metal contact 126, through the n+ connection 116, through the n+ buried layer 104, through the n+ region 115, through the dielectric material 112, and through the conductive material 114 to the metal contact 122 (path 132 shown in phantom) is approximately a few Mohms or greater, depending primarily on the thickness and material type of the dielectric material 112. Thereafter, to "blow" or "program" the first antifuse 100, the metal contacts 128 and 129 are grounded (e.g., so as to ground the p− substrate 102 and the p− region 131) and a predetermined voltage or higher sufficient to breakdown the dielectric material 112 is applied between the metal contact 126 and the metal contact 122. Preferably, the metal contact 122 is grounded to avoid reverse breakdown of the n+ surface ring contact 120 to p− region 131 junction.

Because of the increased thickness of the dielectric collar 112a relative to the remainder of the dielectric material 112, dielectric breakdown typically occurs within the portion of the trench 108 located below the n+ buried layer 104. Once dielectric breakdown has occurred, a low resistance path is created through the dielectric material 112 such that the electrical resistance of the path 132 drops to a few kohms or less, depending primarily on the dielectric material 112's thickness and the dopant concentration of the n+ buried layer 104 and the remainder of the path 132. If the dielectric material 112 comprises an NO stack having an overall thickness of about 45 angstroms, the voltage required to blow the first antifuse 100 is about 8 volts or higher. Note that the path 132 is merely representative of a typical current path and that other paths may be created through the antifuse 100.

Figure 1B:
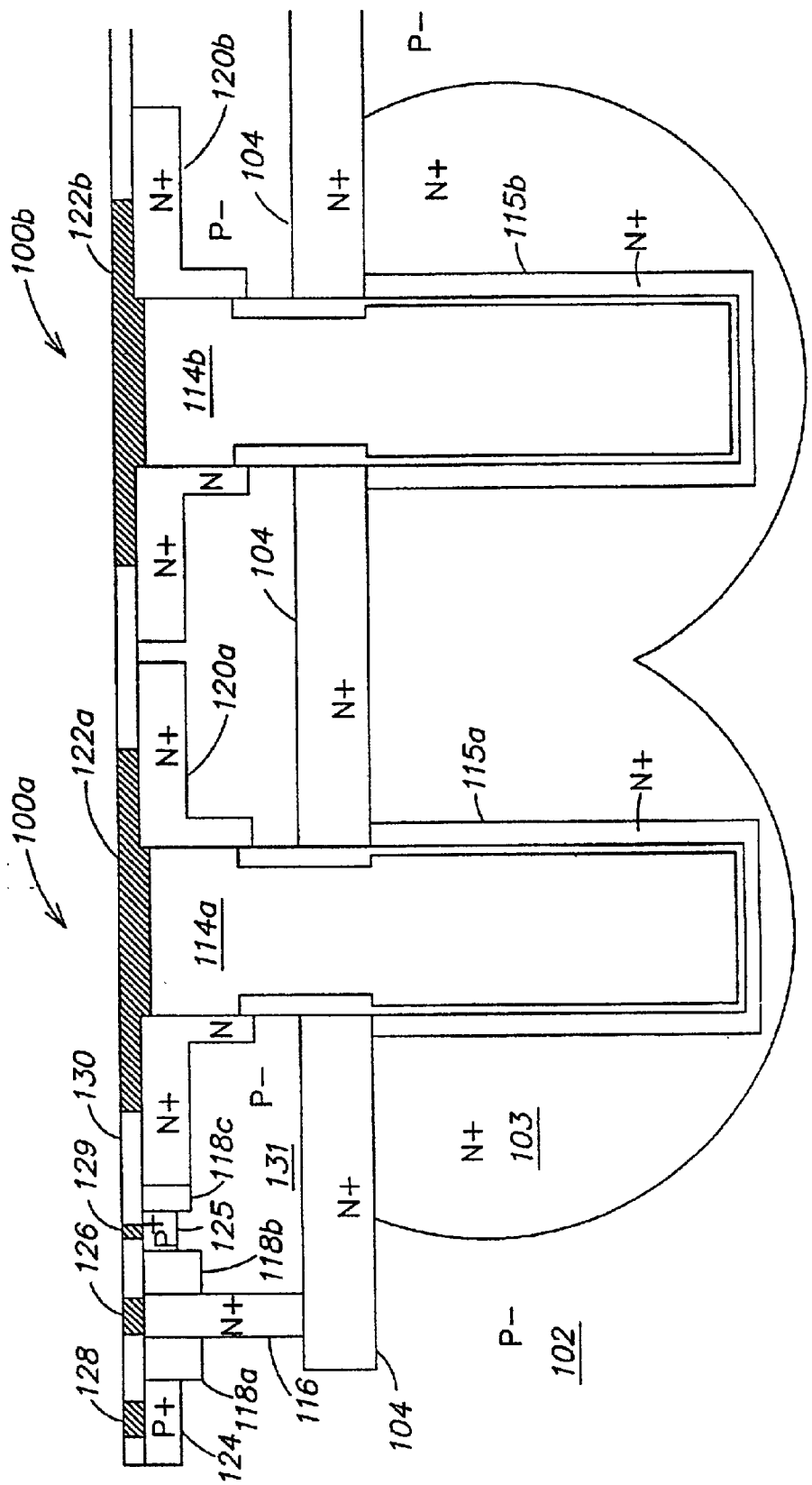
FIG. 1B is a cross-sectional diagram of a plurality of the first antifuses of FIG. 1A that share an n+ buried layer.

FIG. 1B is a cross-sectional diagram of a plurality of the first antifuses 100 that share the n+ buried layer 104. With reference to FIG. 1B, an antifuse 100a and an antifuse 100b are formed within the p− substrate 102 as previously described. Each antifuse 100a, 100b is similar to the first antifuse 100 of FIG. 1A with the primary exception that the "first" terminal of each antifuse (e.g., the n+ buried layer 104, the n+ connection 116 and the metal contact 126) and the p+ region 124 are shared by each antifuse. In this manner, to program the antifuse 100a, the metal contact 122a may be grounded while a sufficiently high voltage is applied to the metal contact 126. Before, simultaneously or thereafter, the metal contact 122b may be grounded to program the antifuse 100b. An array of the first antifuse 100 thus can be easily formed.

Figure 1C:
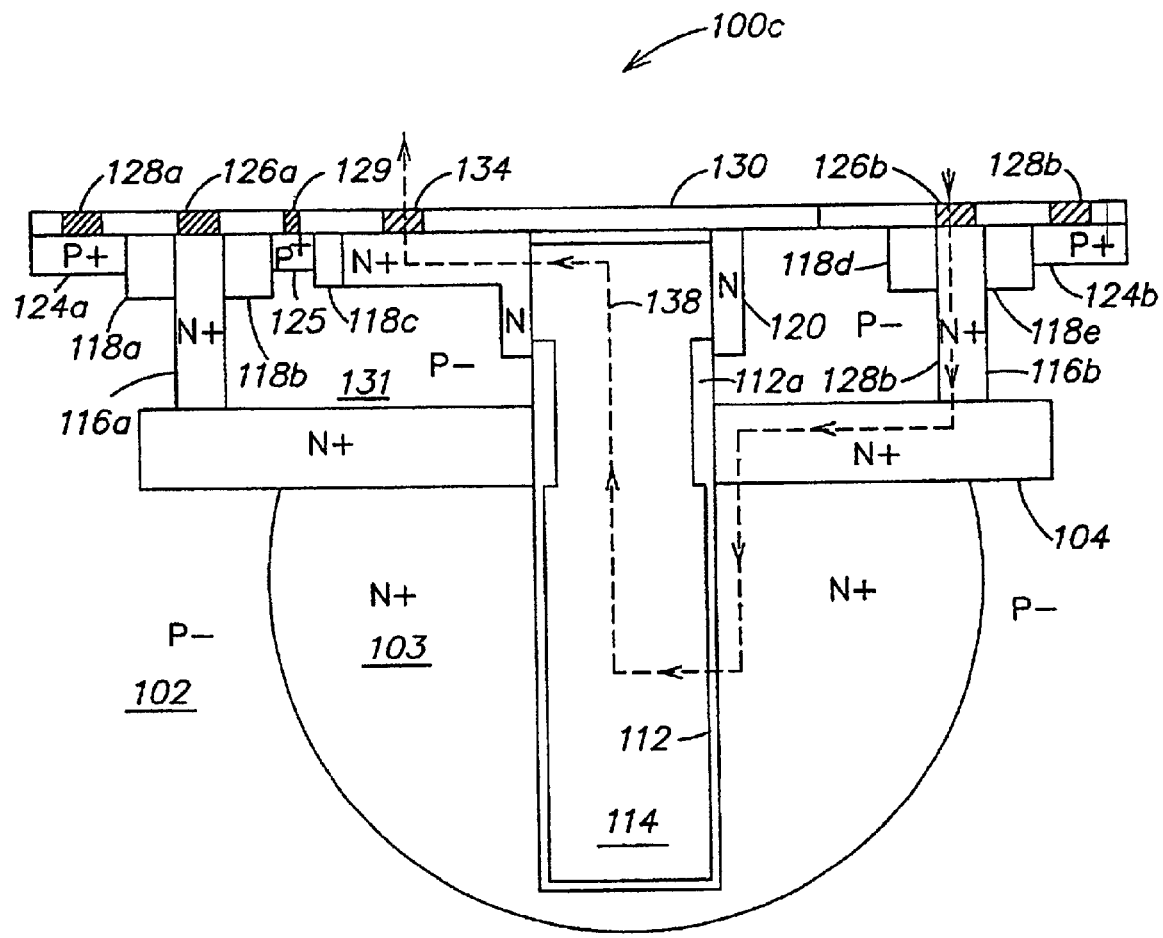
FIG. 1C is a cross-sectional diagram of an antifuse that represents an alternative embodiment of the first antifuse of FIG. 1A.

FIG. 1C is a cross-sectional diagram of an antifuse 100c that represents an alternative embodiment of the first antifuse 100 of FIG. 1A. The antifuse 100c is similar to the first antifuse 100. However, unlike the first antifuse 100, the antifuse 100c does not employ the n+ region 115 or the metal contact 122 (although the metal contact 122 may be employed if desired). In place of the metal contact 122, a metal contact 134 to the surface contact ring 120 is formed within the silicon dioxide layer 130 as shown.

In addition, instead of employing a single n+ connection 116, and a single p+ region 124, the antifuse 100c employs a first and a second n+ connection 116a, 116b (and multiple STI regions 118a–e, and first and second metal contacts 126a, 126b) and a first and a second p+ region 124a, 124b. Only one p+ region may be employed if desired, and the surface contact ring 120 may be simplified as shown.

The antifuse 100c operates similarly to the first antifuse 100: to program the antifuse 100c, the first and the second metal contacts 128a, 128b and the metal contact 129 are grounded (e.g., so as to ground the p− substrate 102 and the p− region 131) and a predetermined voltage or higher sufficient to breakdown the dielectric material 112 is applied between the metal contact 134 (which is preferably grounded) and the first and second metal contacts 126a, 126b. Because of the increased thickness of the dielectric collar 112a relative to the remainder of the dielectric material 112, dielectric breakdown typically occurs within the portion of the trench 108 below the n+ buried layer 104. A current path 138 thereby is formed through the antifuse 100c.

Figure 2A:
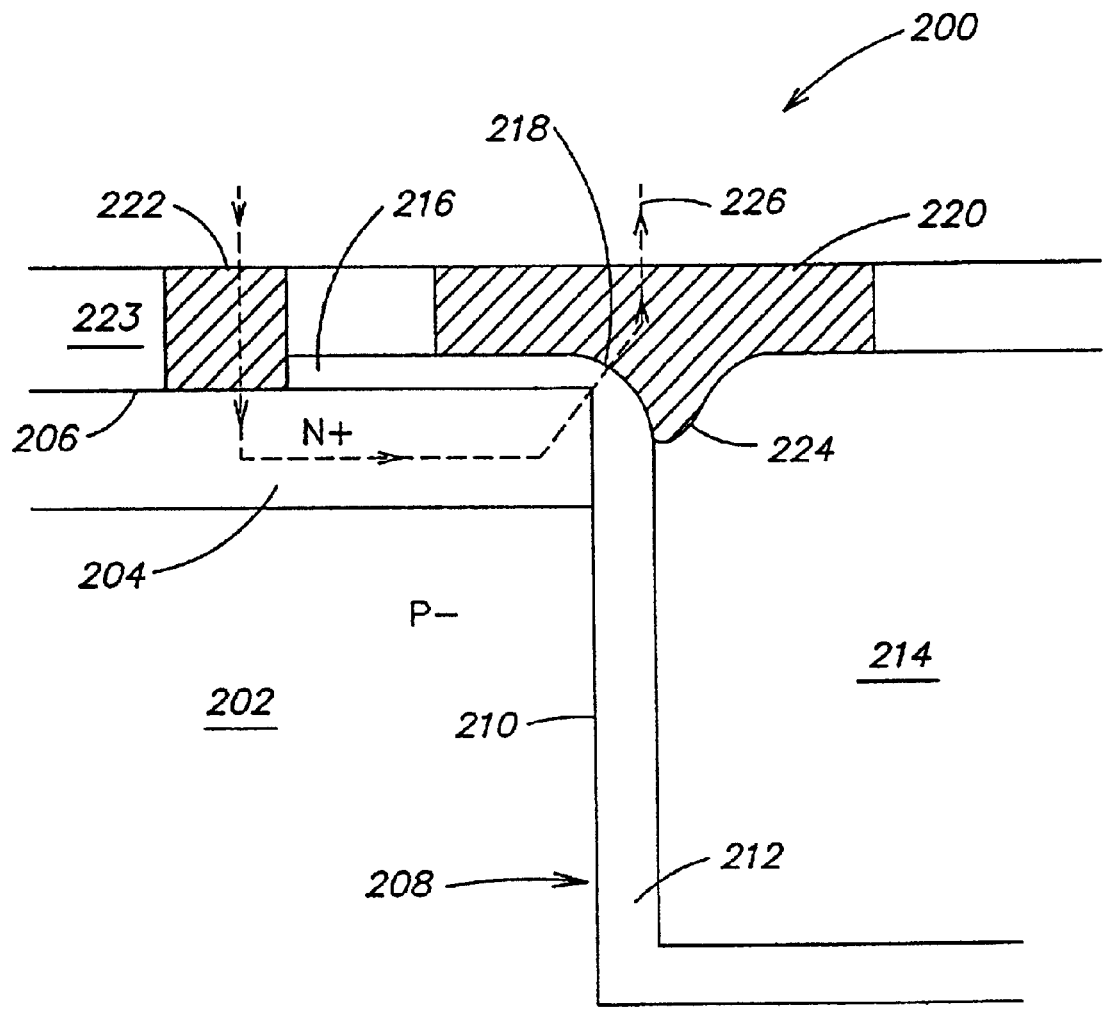
FIG. 2A is a cross-sectional diagram of a second antifuse element configured in accordance with a second aspect of the invention.

FIG. 2A is a cross-sectional diagram of a second logic element (second antifuse element 200) configured in accordance with a second aspect of the invention. The second antifuse 200 is based on an STI structure and comprises a p− substrate 202 having an n+ region 204 (e.g., a source/drain diffusion region) formed below a surface 206 of the p− substrate 202. The preferred doping level of the p− substrate 202 is about $1 \times 10^{15} – 1 \times 10^{16}$ cm$^{-3}$ and of the n+ region 204 is about $5 \times 10^{19}$ cm$^{-3}$.

An STI trench 208 comprising an interior surface 210 is formed through the surface 206 and the n+ region 204 and is lined with a first dielectric material 212. The first dielectric material 212 may comprise a gate quality oxide, nitride, oxide-nitride stack or the like. Preferably the first dielectric material 212 comprises an oxide-nitride stack. The lined STI trench 208 is filled with a second dielectric material 214 and the resulting structure is planarized so that the second dielectric material 214 resides only within the lined STI trench 208. The second dielectric material 214 preferably comprises a deposited oxide (e.g., formed by a TEOS process as is known in the art), although other dielectric materials may be employed.

A dielectric layer 216 (e.g., a gate quality oxide, nitride or oxide-nitride stack) is formed over a portion of the n+ region 204 so as to contact the first dielectric material 212 at a "merge" location 218. The dielectric layer 216 preferably comprises an oxide having a thickness of about 30 to 80 angstroms. A first electrode (e.g., a polysilicon gate 220) is formed over a portion of both the dielectric layer 216 and the filled STI trench 208 as shown. To allow electrical connection to the n+ region 204, a metal contact 222 to the n+ region 204 is provided and is electrically insulated from the polysilicon gate 220 via an insulating layer 223 (e.g., an oxide).

The fabrication of STI structures similar to the second antifuse 200 is well known in the art. (See, for example. D. Kenney et al., "A Buried Plate Trench Cell for 64 Mb "

Symp. VLSI Tech. Digest, pp.14–15 (1992)). Within such STI structures it has been recognized that the oxide thinning at STI trench edges occurs as a consequence of the abrupt edges associated with STI trenches. (See, for example, W. Tonti et al., "Impact of Shallow Trench Isolation on Reliability of Buried-and Surface-Channel sub-$\mu$m PFET", IEEE International Reliability Physics Proceedings, pp.24–29 (1995)). For example, to fabricate the second antifuse 200, the STI trench 208 is formed, lined with the first dielectric material 212, filled with second dielectric material 214 and planarized. The dielectric layer 216 then is grown and a "screen oxide" is deposited over the p– substrate 202 to serve as an implant diffusion Thereafter, the n+ region 204 is implanted and the screen oxide is removed by etching. Due to anisotropic etching of the second dielectric material 214 during etching of the screen oxide, a divot 224 is formed in the second dielectric material 214 that typically has a depth of about 100–300 angstroms. The dielectric layer 216/first dielectric material 212 covering the corner of the n+ region 204 (near the merge location 218) also is thinned during this etch process. The subsequently deposited polysilicon gate 220 fills the divot 224 as shown.

Following fabrication, the second antifuse 200 is in an unblown or unprogrammed state and the electrical resistance of the path from the metal contact 222 through the n+ region 204, and through the dielectric layer 216 to the polysilicon gate 220 (path 226 shown in phantom) is approximately a few Mohms or greater, depending primarily on the thickness and material type of the dielectric layer 216 and the first dielectric material 212 in the vicinity of the merge location 218. Thereafter, to program the second antifuse 200, the p– substrate 202 is grounded (via a substrate contact not shown) and a predetermined voltage or higher sufficient to breakdown the thinned dielectric layer 216/first dielectric material 212 near the merge location 218 is applied between the polysilicon gate 220 and the metal contact 222 (e.g., typically by grounding the polysilicon gate 220).

Because of the thinning of the dielectric layer 216 and the first dielectric material 212 near the merge location 218, dielectric breakdown typically occurs near the merge location 218. Once dielectric breakdown has occurred, a low resistance path is created through the dielectric layer 216 and/or the first dielectric material 212 near the merge location 218 such that the electrical resistance of the path 226 drops to a few Kohms or less (depending primarily on the relative doping concentration of the n+ region 204 and the path 226, and the thickness of the dielectric material near the merge location 218). If the dielectric layer 216 comprises an oxide having a thickness of about 60 angstroms, and the first dielectric material 212 comprises an oxide having a thickness of about 40 angstroms, the voltage required to blow the second antifuse 200 is about 8 volts or higher.

Figure 2B:
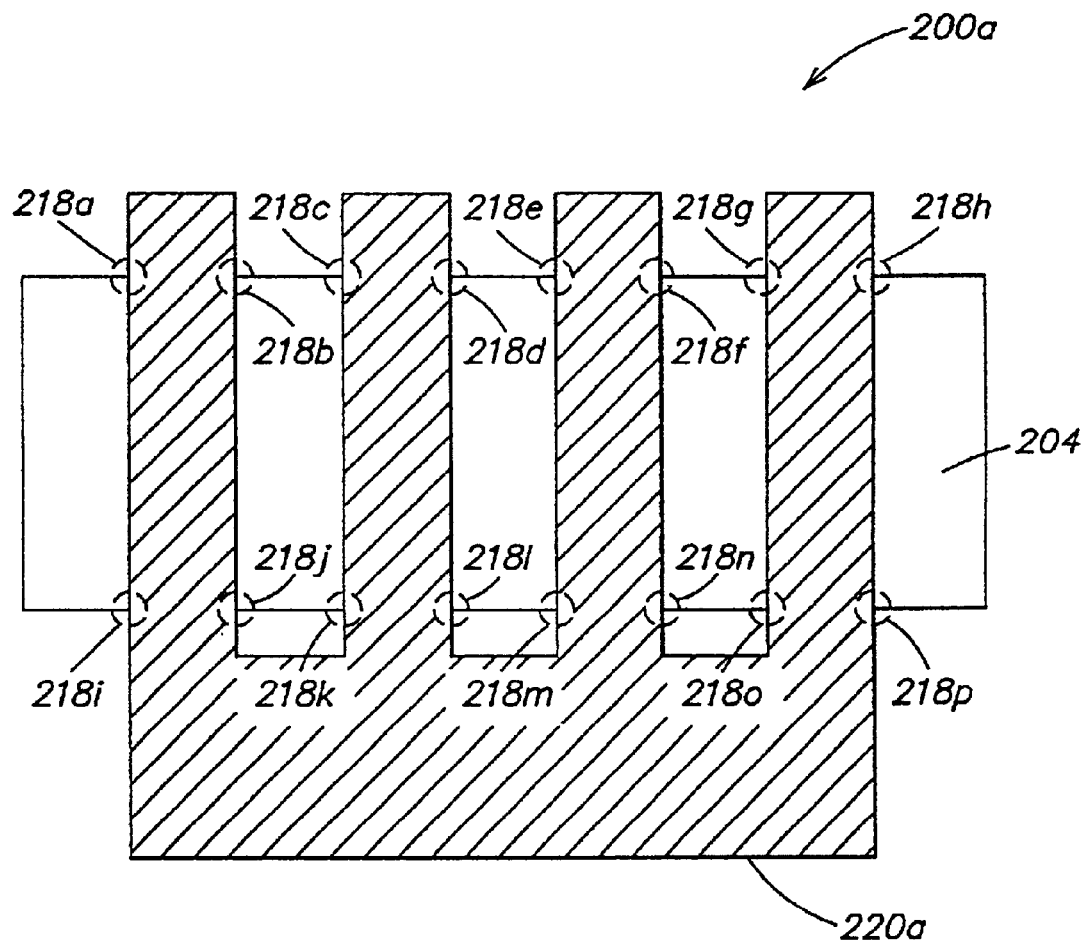
FIG. 2B is a top plan view of an antifuse employing a gate electrode that extends over the entire width of an n+ region.

To increase the number of merge locations at which dielectric breakdown can occur (e.g., so as to ensure that dielectric breakdown does occur at the desired breakdown voltage), a finger structure or any other similar structure may be employed for the polysilicon gate 220. For example, FIG. 2B is a top plan view of an antifuse 200$a$ employing a gate electrode 220$a$ that extends over the entire width of the n+ region 204 as shown. Unlike the second antifuse 200 of FIG. 2A which has a maximum of two high field merge locations 218 wherein the polysilicon gate 220, the dielectric layer 216 and the first dielectric material 212 converge (e.g., one on each edge of the polysilicon gate 220), the antifuse 200$a$ has sixteen high filed merge locations 218$a$–$p$ (as shown in phantom). The likelihood of dielectric breakdown at the desired voltage thereby is greatly increased. The use of a p+ diffusion region instead of the n+ region 204 reduces the breakdown voltage of the antifuse 200$a$ by approximately 1 volt due to work function differences.

Figure 3A:
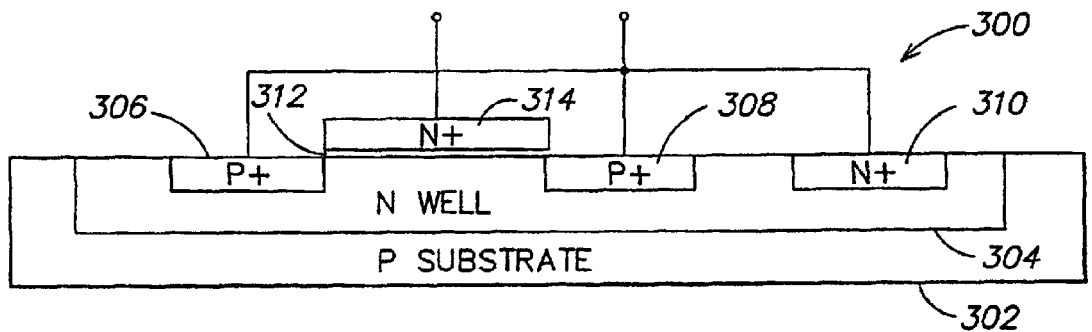
FIG. 3A is a cross-sectional view of a first metal-oxide-semiconductor (MOS) based antifuse that employs the antifuse structure of FIG. 2A.
Figure 3B:
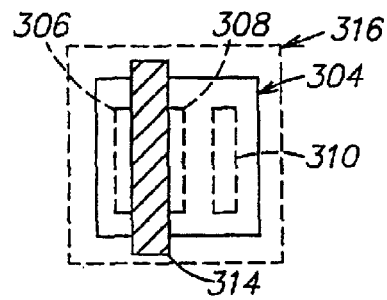
FIG. 3B is a top plan view of the first MOS-based antifuse of FIG. 3A.

FIG. 3A is a cross-sectional view of a first metal-oxide-semiconductor (MOS) based antifuse 300 that employs the antifuse structure of FIG. 2A. The first MOS-based antifuse 300 comprises a p-type substrate 302 having an n-well region 304 formed therein. A p-type source region 306, a p-type drain region 308 and an n-type well contact region 310 are formed within the n-well region 304. The preferred doping level for the p-type substrate 302 is about $1\times10^{15}$–$1\times10^{16}$ cm$^{-3}$, for the n-well region 304 is about $4\times10^{17}$–$2\times10^{18}$ cm$^{-3}$, for the p-type source region 306 and the p-type drain region 308 is about $5\times10^{19}$ cm$^{-3}$ and for the n-type well contact region 310 is about $5\times10^{19}$ cm$^{-3}$. A gate dielectric 312 is formed over the n-well region 304 between the p-type source region 306 and the p-type drain region 308, and an n+ polysilicon gate 314 is formed over the gate dielectric 312. The gate dielectric 312 preferably comprises an oxide, a nitride or an oxide/nitride stack having the same thickness as the dielectric layer 216 of FIG. 2A. The preferred doping level for the n+ polysilicon gate 314 is about $5\times10^{19}$–$2\times10^{20}$ cm$^{-3}$. As with the polysilicon gate 220 of FIG. 2A, the n+ polysilicon gate 314 is terminated over an STI trench 316 as illustrated in the top plan view of FIG. 3B.

To program the first MOS-based antifuse 300, the n+ polysilicon gate 314 is grounded and a predetermined voltage or higher sufficient to breakdown the thinned gate dielectric 312/STI liner dielectric (not shown) near the edge of the STI trench 316 is applied to the n-type well contact region 310, to the p-type source region 306 and to the p-type drain region 308. Because of dielectric thinning, dielectric breakdown occurs near the merge location of the gate dielectric 312 and the lining of the STI trench 316 (not shown) as described previously with reference to FIG. 2A. A low resistance path thereby is created from the n-type well contact region 310 through the n-well region 304, through the gate dielectric 312/STI trench 316 lining merge location, and to the n+ polysilicon gate 314. Note that the p-type drain region 308 and the n-type well contact region 310 should remain at the same voltage potential to avoid pn junction breakdown during the programming of the first MOS-based antifuse 300.

Figure 3C:
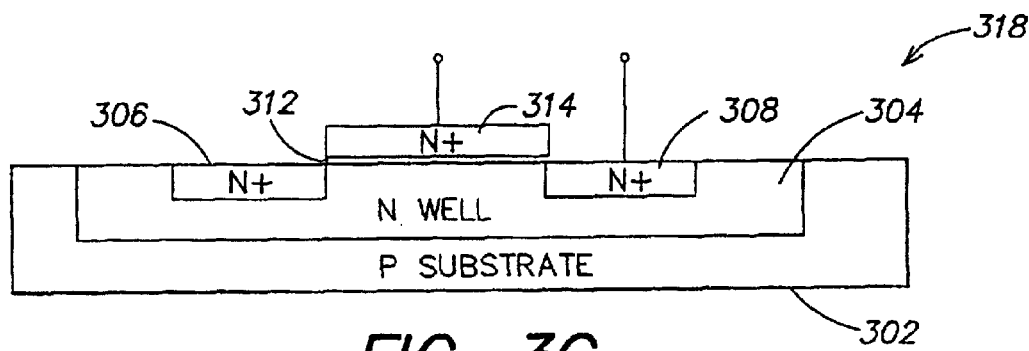
FIG. 3C is a cross-sectional view of a second MOS-based antifuse that represents a first alternative embodiment of the first MOS-based antifuse of FIG. 3A.

FIG. 3C is a cross-sectional view of a second MOS-based antifuse 318 that represents a first alternative embodiment of the first MOS-based antifuse 300 of FIG. 3A. The second MOS-based antifuse 318 is similar to the first MOS-based antifuse 300 with the exception that the conductivity type of the source region 306 and the drain region 308 has been changed from p-type to n-type (to match the n-well conductivity type), and the n-type well contact region 310 has been eliminated. In this manner, a high voltage may be applied to the n-well region 304 merely by applying the voltage to the source region 306 or the drain region 308 so that the n-type well contact region 310 is not required. The area of the second MOS-based antifuse 318 thereby is greatly reduced relative to the first MOS-based antifuse 300, and a high voltage may be stored on the wells.

Figure 3D:
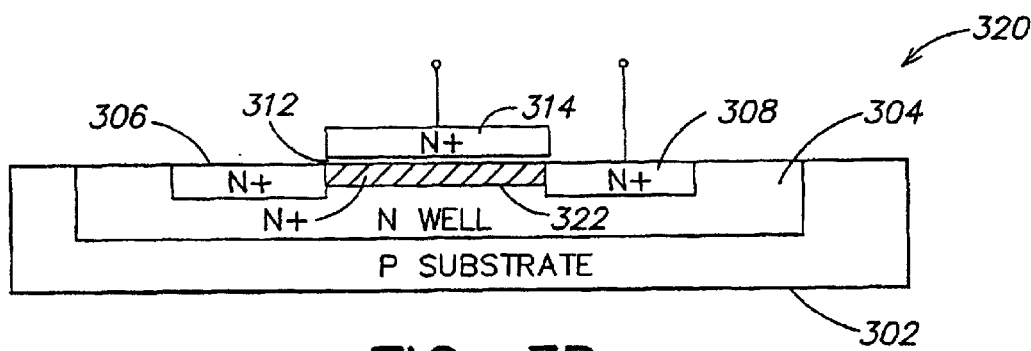
FIG. 3D is a cross-sectional view of a third MOS-based antifuse that represents a second alternative embodiment of the first MOS-based antifuse of FIG. 3A.

FIG. 3D is a cross-sectional view of a third MOS-based antifuse 320 that represents a second alternative embodiment of the first MOS-based antifuse 300. The third MOS-based antifuse 320 is identical to the second MOS-based antifuse 318 with the addition of an n+ doped region 322 (preferably having a doping level greater than about $1\times10^{19}$ cm$^{-3}$) that couples the n-type source region 306 to the n-type drain region 308. The n+ region 322 creates a low resistance path through the n-well region 304 so that the overall electrical resistance of the third MOS-based antifuse 320 is reduced relative to either the overall electrical resistance of the first MOS-based antifuse 300 or of the second MOS-based antifuse 318.

The foregoing description discloses only the preferred embodiments of the invention, modifications of the above disclosed apparatus and method which fall within the scope of the invention will be readily apparent to those of ordinary skill in the art. For instance, any known semiconductor manufacturing processes may be employed to fabricate the antifuses described herein, and each antifuse may be formed within an n– substrate through appropriate alteration of the relevant conductivity types within the antifuse (e.g., by switching n-type regions to p-type regions and vice versa). Further, p-well rather than n-well technology may be employed (e.g., for the antifuses 300, 318 and 320 described with reference to FIGS. 3A–D). The resistance of a blown antifuse may be other than a few kohms or below. For example, a blown resistance of a few tens of kohms or less or a few hundred ohms or less may be employed. Blown resistance may be tailored through appropriate doping level, selection as will be readily apparent to one of ordinary skill in the art. Circuitry for blowing and sensing antifuses is described in previously incorporated U.S. patent application Ser. No. 09/466,479, filed on even date herewith.

Accordingly, while the present invention has been disclosed in connection with the preferred embodiments thereof, it should be understood that other embodiments may fall within the spirit and scope of the invention, as defined by the following claims.

What is claimed is:

1. A method of forming a one time, voltage programmable logic element in a semiconductor substrate of a first conductivity type comprising:

forming a first diffusion layer beneath the surface of the substrate, the first diffusion layer having a second conductivity type;

forming a trench through the surface and passing through the first diffusion layer, the trench having an interior surface;

lining the interior surface of the trench with a first layer of dielectric material at a first thickness;

depositing a second layer of dielectrical material at a second thickness over the first diffusion layer, such that the second thickness is greater than the first thickness and the second layer is recessed below the top surface of the trench;

forming a second diffusion layer in the annular space of the trench on the surface of the substrate;

filling the lined trench with a conductive material that abuts the second diffusion layer;

connecting the top surface of the trench to the semiconductor substrate to form an ohmic contact region;

wherein the logic element is configured so that a predetermined voltage or higher applied between the conductive material and the first diffusion layer results in a programming current to flow through the first diffusion layer and across the first layer of dielectric material below the surface of the substrate; and forming a surface contact structure within the substrate that is coupled to the conductive material filling the trench so as to provide an electrical contact at the top and into the interior surface of the trench, but not to extend to the first layer of dielectric material.

2. The method of claim 1 further comprising:

forming a metal contact coupled to both the surface contact structure and the conductive material.

3. A method of forming a one time, voltage programmable logic element in a semiconductor substrate of first conductivity comprising:

forming a first layer beneath the surface of the substrate, the first layer having a second conductivity type;

forming a trench through the surface and passing through first layer, the trench having an interior surface;

forming a second layer beneath the surface of the substrate, coupled to the first layer and surrounding the trench, the second layer having the second conductivity type;

lining the interior surface of the trench with a dielectric material; and filling the lined trench with a conductive material;

wherein the logic element is configured so that a predetermined voltage or higher applied between the conductive material and the first layer causes a breakdown within a region.

4. A method of forming a one time, voltage programmable logic element in a semiconductor substrate of first conductivity type comprising:

forming a first layer in a surface of the substrate, the first layer having a second conductivity type;

forming a trench through the surface and passing through the first layer, the trench having an interior surface;

lining the interior surface of the trench with a first dielectric material;

filling the lined trench with a second dielectric material;

forming a dielectric layer over a portion of the first layer so that the dielectric layer contacts the first dielectric material lining the trench at a merge location; and forming an electrode extending over a portion of both the dielectric layer and the filled trench;

wherein the logic element is configured so that a predetermined voltage or higher applied between the electrode and the first layer causes a breakdown near the merge location.

5. The method of claim 4 further comprising:

forming a third diffusion region of the second conductivity type within the first layer so as to connect the first and second diffusion regions.

6. The method of claim 4 wherein forming a trench through the surface and passing through the first layer comprises forming a stacked trench isolation trench.

7. The method of claim 4 further comprising:

forming a first diffusion region of the second conductivity type within the first layer on a first side of the electrode; and forming a second diffusion region of the second conductivity type within the first layer on a second side of the electrode.

* * * * *